United States Patent
Davis et al.

(10) Patent No.: US 9,535,471 B2
(45) Date of Patent: Jan. 3, 2017

(54) DATA STORAGE SYSTEM AND A METHOD OF COOLING A DATA STORAGE SYSTEM

(71) Applicant: Seagate Technology LLC, on behalf of Xyratex Technology Limited, a Seagate Company, Cupertino, CA (US)

(72) Inventors: David Michael Davis, Portsmouth (GB); Alexander Carl Worrall, Waterlooville (GB)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 706 days.

(21) Appl. No.: 13/773,530

(22) Filed: Feb. 21, 2013

(65) Prior Publication Data

US 2014/0233179 A1  Aug. 21, 2014

(51) Int. Cl.
| G06F 1/16 | (2006.01) |
| H05K 5/00 | (2006.01) |
| H05K 7/00 | (2006.01) |
| G06F 1/20 | (2006.01) |
| H05K 7/20 | (2006.01) |

(52) U.S. Cl.
CPC ........... *G06F 1/206* (2013.01); *H05K 7/20727* (2013.01)

(58) Field of Classification Search
CPC .............. G06F 1/20; G06F 1/203; G06F 1/206
USPC ................................... 361/679.54, 724–727
See application file for complete search history.

(56) References Cited

U.S. PATENT DOCUMENTS

| 6,144,553 A | 11/2000 | Hileman et al. |
| 7,042,720 B1 | 5/2006 | Konshak et al. |
| 7,304,855 B1* | 12/2007 | Milligan .............. G11B 33/128 361/724 |
| 7,859,834 B2* | 12/2010 | Fukuda ................ G11B 33/022 361/679.46 |
| 2003/0224645 A1 | 12/2003 | Smith et al. |
| 2005/0114876 A1* | 5/2005 | Atarashi ............ G11B 33/1406 720/649 |
| 2006/0077776 A1 | 4/2006 | Matsushima et al. |
| 2011/0075367 A1 | 3/2011 | Campbell et al. |
| 2012/0020008 A1 | 1/2012 | Dunwoody et al. |
| 2013/0021696 A1 | 1/2013 | Davis et al. |

OTHER PUBLICATIONS

United Kingdom Search and Examination Report dated Jun. 6, 2013 in corresponding Great Britain Patent Application No. GB1303113.3.

* cited by examiner

*Primary Examiner* — Anthony Haughton
(74) *Attorney, Agent, or Firm* — Holzer Patel Drennan

(57) ABSTRACT

A data storage system and a method of cooling the data storage system are presented. The data storage system includes: an enclosure; one or more drawer structures disposed within the enclosure, wherein at least one of the drawer structures is configured to receive one or more electronic devices; and one or more temperature control elements positioned adjacent to the bottom of the at least one drawer structure, wherein at least one of the temperature control elements is arranged in use to thermally communicate with at least one of the electronic devices.

20 Claims, 9 Drawing Sheets

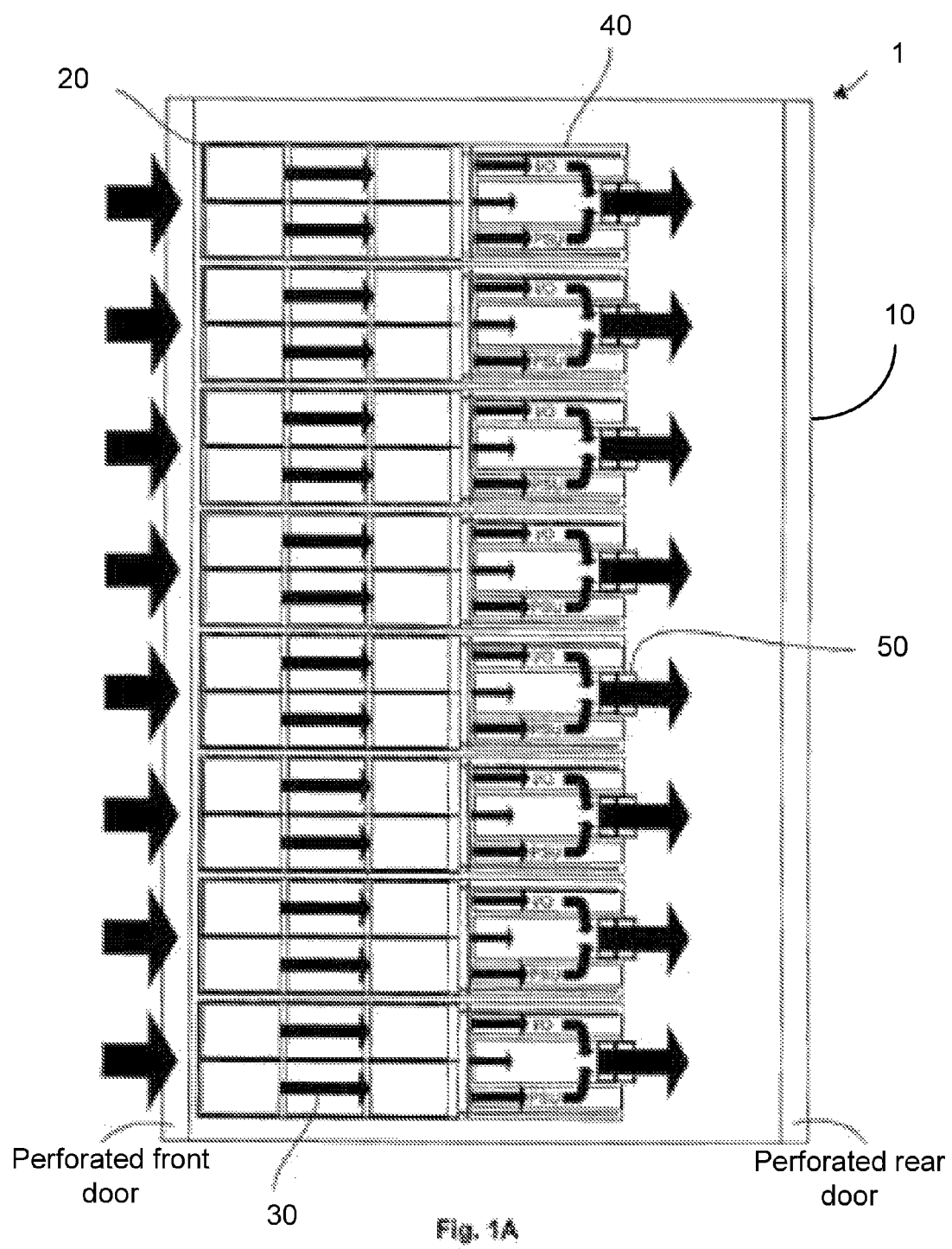

DATA STORAGE SYSTEM AND A METHOD OF COOLING A DATA STORAGE SYSTEM

The present invention relates to a data storage system and a method for cooling a data storage system.

In embodiments, the present invention relates to a data storage system and a method for cooling a data storage system that enables the electronic devices of the data storage system to be cooled more efficiently and with a higher degree of control and flexibility.

A data storage system typically includes a number of different electronic components including data storage media, high power solid state devices, compute modules, switches, controllers, and other electronic devices. The data storage media, such as magnetic disk drives, solid state disk drives, or any other suitable storage media, are arranged within the data storage system so as to enable data to be written to and read from individual data storage media.

An example of a known storage system is the data storage system of the present assignee, as described in US-A-2013/0021696, the entire content of which is hereby incorporated by reference. This example of a data storage system comprises a rack enclosure within which are placed drawers of disk drives. The disk drives are arranged in stacks in the vertical direction and in arrays in the horizontal plane within a drawer. The stacks of disk drives are arranged with no intervening structure between each stack so that air can travel through and between the stacks. Airflow generating means are provided within the rack enclosure to generate a vertical airflow so that, when in operation, the disk drives are cooled by the passing airflow.

FIG. 1A shows another example of a data storage system. As shown, the data storage system 1 includes an enclosure 10 and a plurality of drawers 20 each arranged to receive a plurality of disk drives 30. A number of electronic modules 40, such as input/output (I/O) modules, interconnect modules, cooling modules, interconnecting planes with appropriate sockets and/or cabling, and other electronic modules may be provided within the enclosure 10. When in operation, the electronic modules 40 together with the plurality of disk drives 30 enable data to be written to and read from the disk drives 30 of the data storage system 1. An example of a drawer 20 of FIG. 1A is shown in isolation in FIG. 1B. As shown, the drawer 20 comprises a frame 22 having cross members 24 running between side members 26 that divide the drawer 20 into compartments. The compartments are arranged to receive a number of disk drives, which are then connected to the circuitry (not shown) on the frame 22 of the drawer 20. In turn, the drawer 20 connects to the electronic modules 40 of the data storage system 1 to enable data to be written to and read from the disk drives 30. A number of apertures 28 are provided on the cross members 24 of the drawer 20 to allow air to flow horizontally through the drawer 20 as indicated by the arrow 29 in FIG. 1B. Airflow generating means 50 are provided within the enclosure 10 to generate a horizontal airflow so that, when the drawer 20 is received in the enclosure 10, the disk drives are cooled by the horizontal airflow. The use of such a drawer system enables a large number of disk drives to be housed within each drawer, whilst enabling easy access to individual drives should one need servicing or changing.

Although airflow provides adequate cooling of disk drives in a data storage system for moderate data storage requirements, there are physical and thermal limits to the cooling that airflow can provide. As the demand for space to store larger amounts of data increases, the capacities of data storage media and the densities with which they are packed within a data storage system increase. The increase in capacities and densities means that the power consumption of a data storage system and the amount of heat generated within the system increase.

US-A-2006/0077776 describes a disk array system in which disk drives housed in individual heat-transfer-accelerating units are stacked in a "front loading" manner within a unit box that includes surfaces filled with a refrigerant for cooling the disk drives. U.S. Pat. No. 6,144,553 describes a refrigeration system for disk drives in which a line of stacked disk drives are each sandwiched by a pair of thin conducting plates, which are in turn connected to a common chilled back plate. Although these systems provide cooling for the stacked disk drives, they do not have the flexibility and ease of access that a drawer type system provides.

According to the first aspect of the present invention, there is provided a data storage system, comprising: an enclosure; one or more drawer structures disposed within the enclosure, wherein at least one of the drawer structures is configured to receive one or more electronic devices; and one or more temperature control elements positioned adjacent to the bottom of the at least one drawer structure, wherein at least one of the temperature control elements is arranged in use to thermally communicate with at least one of the electronic devices.

Thus, there is provided an improved drawer type data storage system that provides cooling for the devices housed in the system, whilst providing flexibility and ease of access to those devices.

In particular, the at least one drawer structure further comprises one or more cross members having at least one aperture and is configured to receive the one or more electronic devices arranged so as to enable air to pass horizontally.

The present invention therefore provides efficient cooling by using temperature control elements and allowing air to pass horizontally. The arrangement of the electronic devices to allow horizontal airflow allows the conductive cooling of the temperature control elements to be supplemented by air cooling. Furthermore, the use of a drawer type structure provides flexibility when arranging electronic devices within the drawer to enable a higher density of devices to be achieved within the data storage system.

Preferably, the data storage system further comprises one or more thermal contacts arranged to provide one or more thermal communication pathways between at least one of the temperature control elements and at least one of the electronic devices. This facilitates heat generated by the electronic devices when in operation to be conducted to the temperature control elements, thereby cooling the electronic devices.

In an embodiment, the one or more electronic devices include at least one data storage medium housed in a carrier comprising a thermally conductive material.

Preferably, the carrier includes an opening so as to enable at least one of the thermal communication pathways to extend therethrough to the data storage medium to provide a more direct thermal communication pathway from the data storage medium to the temperature control element. More preferably, at least one of the thermal contacts is formed from a thermally conductive material comprising at least one of the following: thermal grease, silicone grease, metal wire wool, soft polymer, aluminium, carbon nanotube, and elastomer.

In another embodiment, the at least one drawer structure further comprises an open bottom. Preferably, the at least one drawer structure further comprises an open top and is configured to receive the one or more electronic devices arranged so as to enable air to pass vertically. This arrangement allows the vertical airflow to further supplement the cooling provided by the temperature control elements and enables easy access to the electronic devices.

In another embodiment, at least one of the temperature control elements includes one or more apertures. This allows air to flow vertically through the drawer to further supplement the cooling provided by the temperature control elements.

In another embodiment, at least one of the temperature control elements includes an inlet, an outlet, and a fluid flow path extending from the inlet to the outlet to enable a heat exchange fluid to flow from the inlet to the outlet.

In some embodiments, at least one of the drawer structures is arranged to be in thermal communication with at least one of the temperature control elements. This provides cooling for the drawer structure in addition to the electronic devices, thus further improves the overall cooling of the data storage system.

According to another aspect of the present invention, there is provided a method of cooling a data storage system; the data storage system comprising an enclosure, one or more drawer structures disposed within the enclosure, wherein the at least one drawer structure is configured to receive one or more electronic devices, and one or more temperature control elements positioned adjacent to the bottom of the at least one drawer structure; the method comprising: thermally connecting at least one of the electronic devices with at least one of the temperature control element so as to enable transfer of heat from the at least one electronic device to the at least one temperature control element.

In particular, the at least one drawer structure further comprises one or more cross members having at least one aperture, the method further comprising: arranging the electronic devices so as to enable air to pass horizontally.

Preferably, the method further comprises providing a thermal communication pathway between at least one of the temperature control elements and at least one of the electronic devices.

In an embodiment, the one or more electronic devices include at least one data storage medium housed in a carrier comprising a thermally conductive material.

Preferably, the carrier includes an opening, the method further comprises extending at least one of the thermal communication pathways through the opening to the data storage medium.

In another embodiment, the at least one drawer structure further comprises an open bottom. Preferably, the at least one drawer structure further comprises an open top and is configured to receive the one or more electronic devices arranged so as to enable air to pass vertically.

In another embodiment, at least one of the temperature control elements includes one or more apertures.

In another embodiment, at least one of the temperature control elements includes an inlet, an outlet, and a fluid flow path extending from the inlet to the outlet, the method further comprises flowing a heat exchange fluid from the inlet to the outlet.

In another embodiment, the method further comprises thermally connecting at least one of the drawer structures with at least one of the temperature control elements.

According to yet another aspect of the present invention, there is provided a data storage system, comprising: an enclosure; one or more drawer structures disposed within the enclosure, at least one of the drawer structures is configured to receive one or more electronic devices including at least one data storage medium housed in a carrier comprising a thermally conductive material; one or more temperature control elements positioned adjacent to the at least one drawer structure and arranged to be able to thermally communicate with at least one of the electronic devices; and one or more thermal contacts arranged to provide one or more thermal communication pathways between at least one of the temperature control elements and at least one of the electronic devices; wherein the carrier includes an opening so as to enable at least one of the thermal communication pathways to extend therethrough to the data storage medium.

Preferably, at least one of the thermal contacts is formed from a thermally conductive material comprising at least one of the following: thermal grease, silicone grease, metal wire wool, soft polymer, aluminium, carbon nanotube, and elastomer.

In an embodiment, the at least one drawer structure comprises one or more cross members having at least one aperture and is configured to receive the one or more electronic devices arranged so as to enable air to pass horizontally.

In another embodiment, the at least one drawer structure comprises an open top and an open bottom, wherein the one or more electronic devices are arranged so as to enable air to pass vertically.

In another embodiment, at least one of the temperature control elements includes one or more apertures.

In another embodiment, at least one of the temperature control elements includes an inlet, an outlet, and a fluid flow path extending from the inlet to the outlet to enable a heat exchange fluid to flow from the inlet to the outlet.

In another embodiment, at least one of the drawer structures is arranged to be in thermal communication with at least one of the temperature control elements.

Embodiments of the present invention will hereinafter be described by way of examples, with references to the accompanying drawings, in which:

FIG. 1A is a cross-section view of an example of a data storage system;

Figure 2:
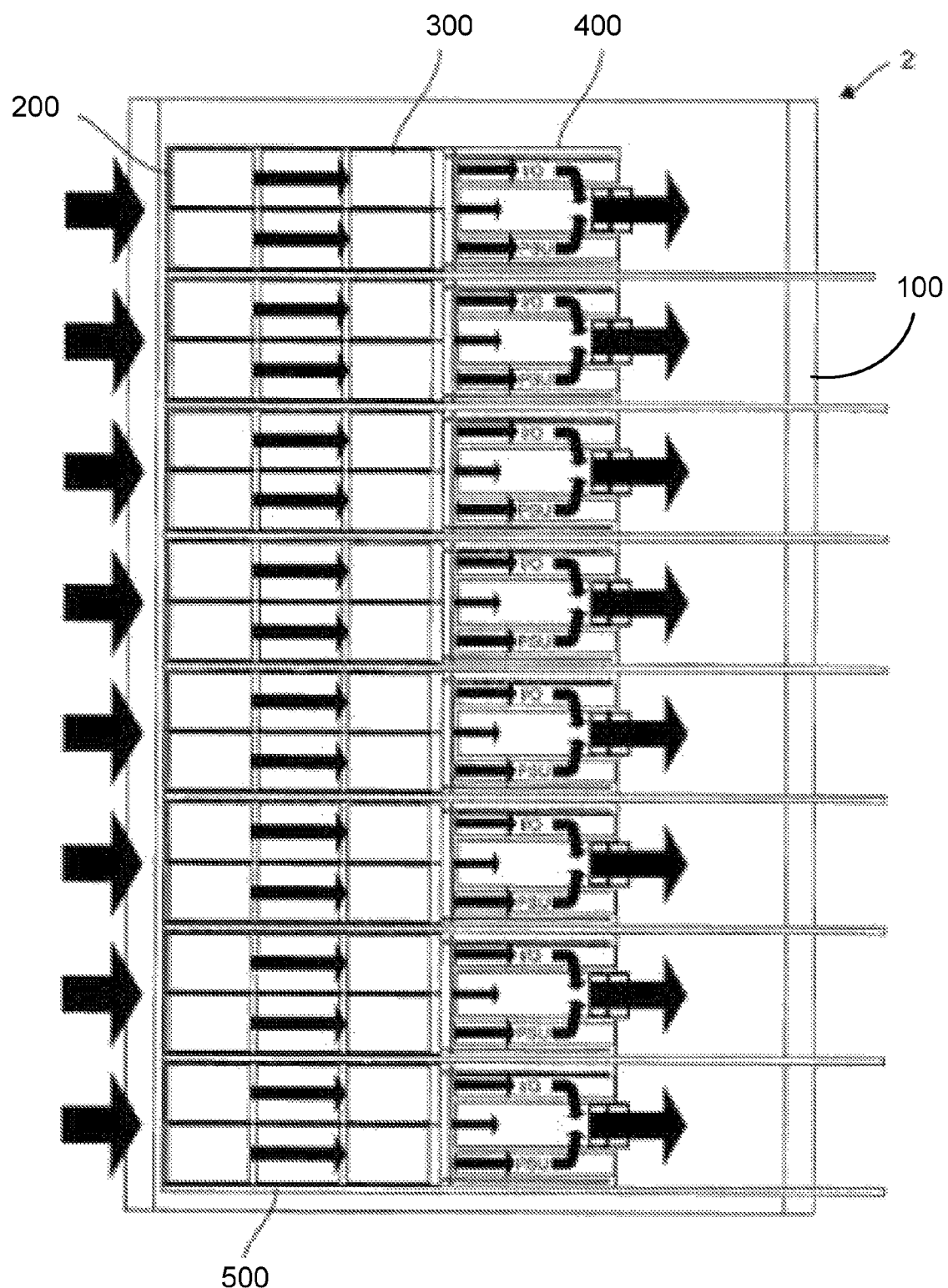
FIG. 2 is a cross-section view of a data storage system.

An embodiment of a data storage system 2 is shown in FIG. 2. The data storage system 2 includes a rack enclosure 100 and a number of drawers 200, each arranged and configured to receive one or more electronic devices 300 including data storage media such as disk drives. Each drawer 200 is further configured to be slidably maneuverable relative to the rack enclosure 100 and can be drawn out of the rack enclosure 100 to enable the electronic devices 300 to be loaded therein. Each drawer 200 may optionally be configured to be removable from the rack enclosure 100 so as to facilitate maintenance. A number of electronic modules 400, such as input/output (I/O) modules, interconnect modules, cooling modules, interconnecting planes with appropriate sockets and/or cabling, and other electronic modules may be provided within the rack enclosure 100. In some embodiments, the data storage medium may be housed in a carrier, which may have electronic circuitry to enable the data storage medium to connect to the electronic modules 400 of the data storage system 2. When in operation, the electronic modules 400 together with the plurality of data storage media and electronic devices 300 enable data to be written to and read from the data storage media of the data storage system 2.

A number of temperature control elements 500 are provided within the rack enclosure 100, each positioned adjacent to a drawer 200. As will be described in more detail below, each temperature control element 500 is positioned so as to enable thermal communication with at least one of the electronic devices 300 that is received within the drawer 200.

Figure 3A:
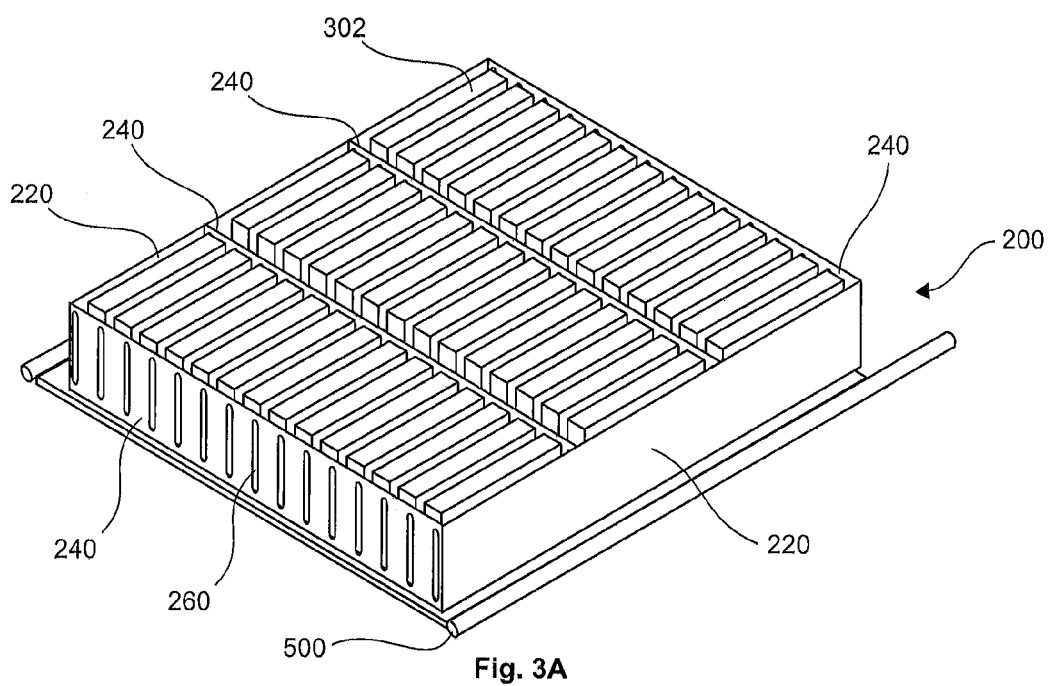
FIG. 3A is a perspective view of an example of a drawer with a temperature control element.

Referring now to FIG. 3A, an example of a drawer 200 populated with data storage media 302 together with an example of a temperature control element 500 are shown in isolation. As shown in FIG. 3A, the drawer 200 includes two side members 220 and a number of cross members 240 extending between the side members 220. Such an arrangement provides a "ladder type" structure with an open top and an open bottom. The side members 220 and cross members 240 are arranged into compartments within the drawer 200 and may provide support so as to enable the drawer 200 to receive and retain the electronic devices 300 within the compartments. A number of apertures 260 may optionally be provided on each cross member 240. Electronic circuitry (not shown in FIG. 3A) may be provided on the side members 220 and/or cross members 240 so as to enable the electronic devices 300 received within the drawer 200 to connect to the electronic modules 400 of the data storage system 2.

Figure 3B:
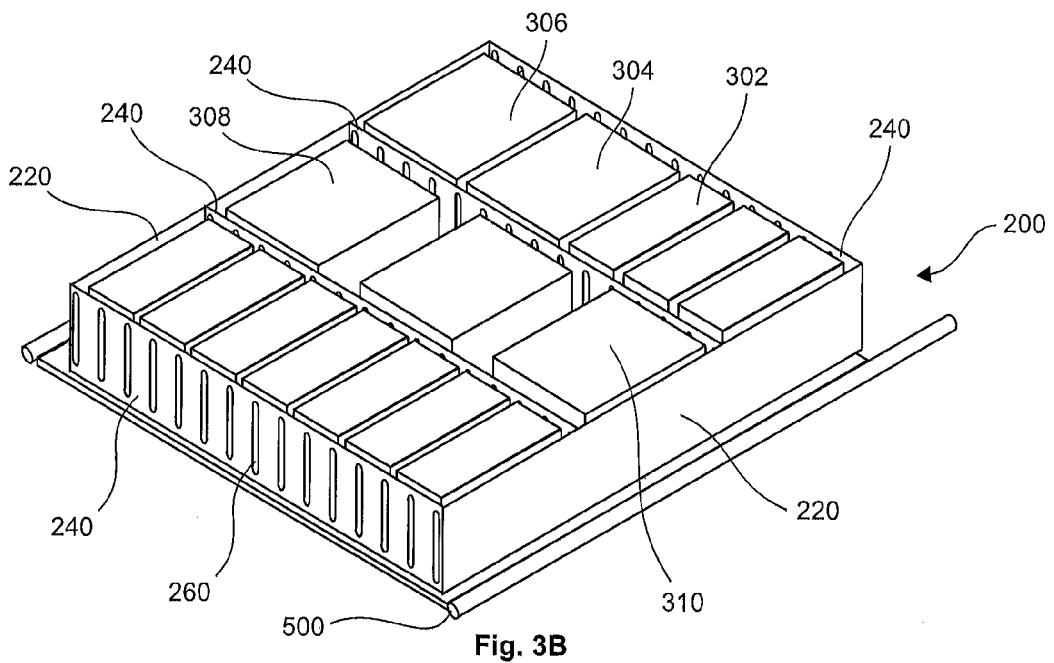
FIG. 3B is a perspective view of another example of a drawer with a temperature control element.

The temperature control element 500 is provided in the proximity below the drawer 200 and is positioned such that, when one or more data storage media 302 is or are received within the drawer 200, thermal communication pathways may be established to allow heat to be extracted and/or transferred from the data storage media 302 to the temperature control element 500. Optionally, additional thermal communication pathways may be provided to allow heat transfer from the drawer 200, including the side members 220 and cross members 240, to the temperature control element 500. In some alternative embodiments such as that shown in FIG. 3B, the drawer 200 may be arranged and configured to receive a combination of different electronic devices 300 in addition to data storage media 302. The different electronic devices may be, but are not limited to, serial attached SCSI expander modules 304, processor modules 306, protocol conversion modules 308, or form factor adaptor modules 310. It will be appreciated that the drawer 200 may also be arranged and configured to receive any suitable types of data storage media 302 including, but not limited to, magnetic disk drives and solid state disk drives. It will also be appreciated that the drawer 200 may be of arranged in ways other than the "ladder type" structure. For example, the drawer 200 may have a conductive bottom to facilitate thermal communication between the electronic devices 300 and the temperature control element 500.

Figure 4:
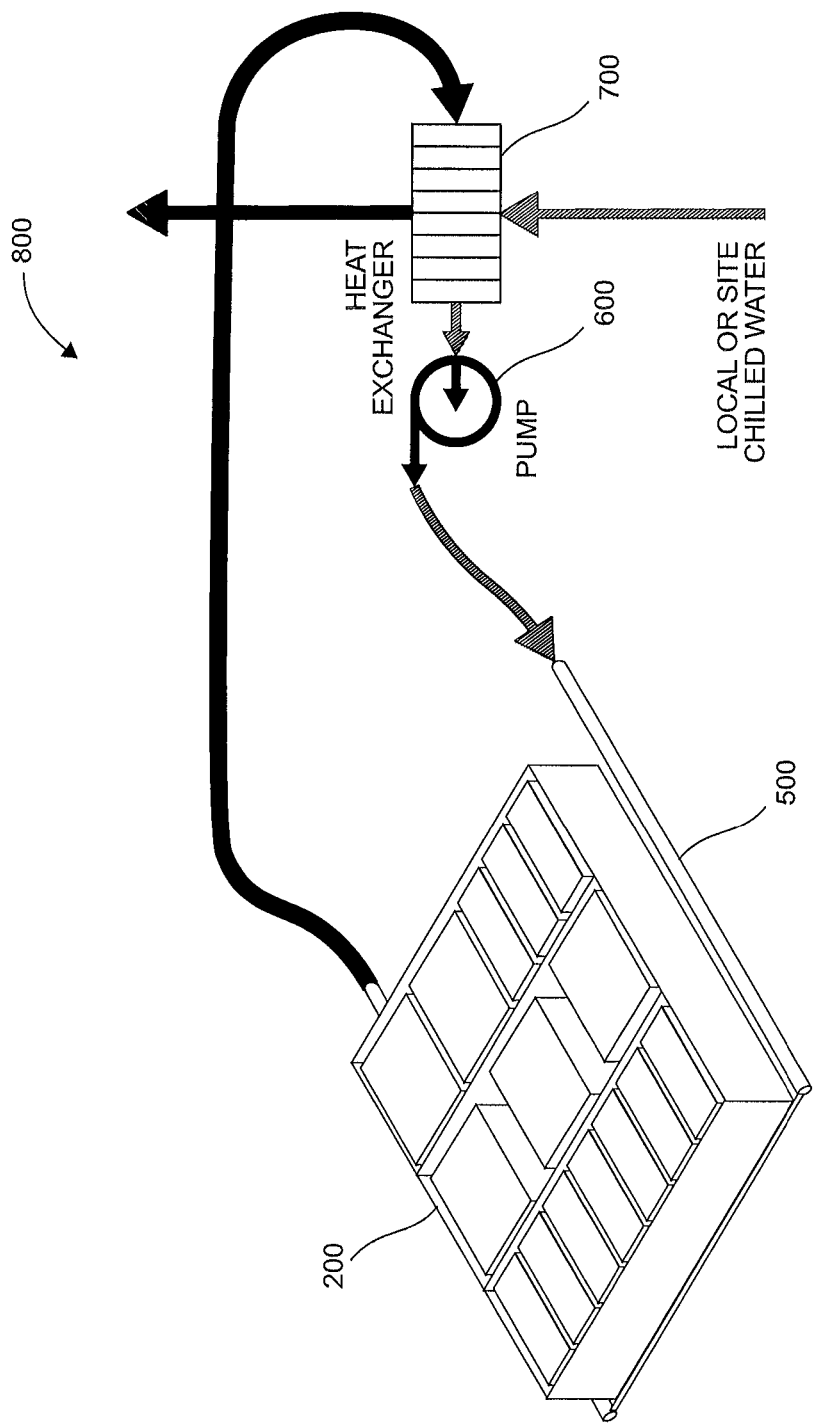
FIG. 4 is a schematic illustration of an example of a drawer with a temperature control element connected to a fluid flow.

The temperature control element 500 may, in some embodiments, be a heat exchanger. In these embodiments, the temperature control element 500 includes a plate shape body having an inlet, an outlet, and a fluid flow path within the body that extends from the inlet to the outlet. The inlet enables a heat exchange fluid, such as water or other suitable fluid, to flow into the fluid flow path. The body is preferably formed from a material with a high thermal conductivity so as to enable heat external to the temperature control element 500, such as the heat generated by an electronic device 300 received in the drawer 200, to transfer to the heat exchange fluid. As shown in FIG. 4, the temperature control element 500 may be further arranged to be connected, via the inlet and the outlet, to a pump 600 and another suitable heat exchanger 700 to form a fluid flow loop 800. The pump 600 enables the heat exchange fluid to circulate around the fluid flow loop 800, carrying the heat exchange fluid from the temperature control element 500 to the heat exchanger 700 for cooling before continuing to circulate around the fluid low loop 800.

It will be appreciated that the temperature control elements 500 may be other suitable devices capable of extracting and transporting heat. For example, the temperature control elements 500 may be, but are not limited to, cryogenic cold plates, thermoelectric cold plates, or other suitable cooling devices. In general, the temperature control elements 500 preferably include a thin, plate-like body, which may be continuous or include one or more apertures.

Figure 5:
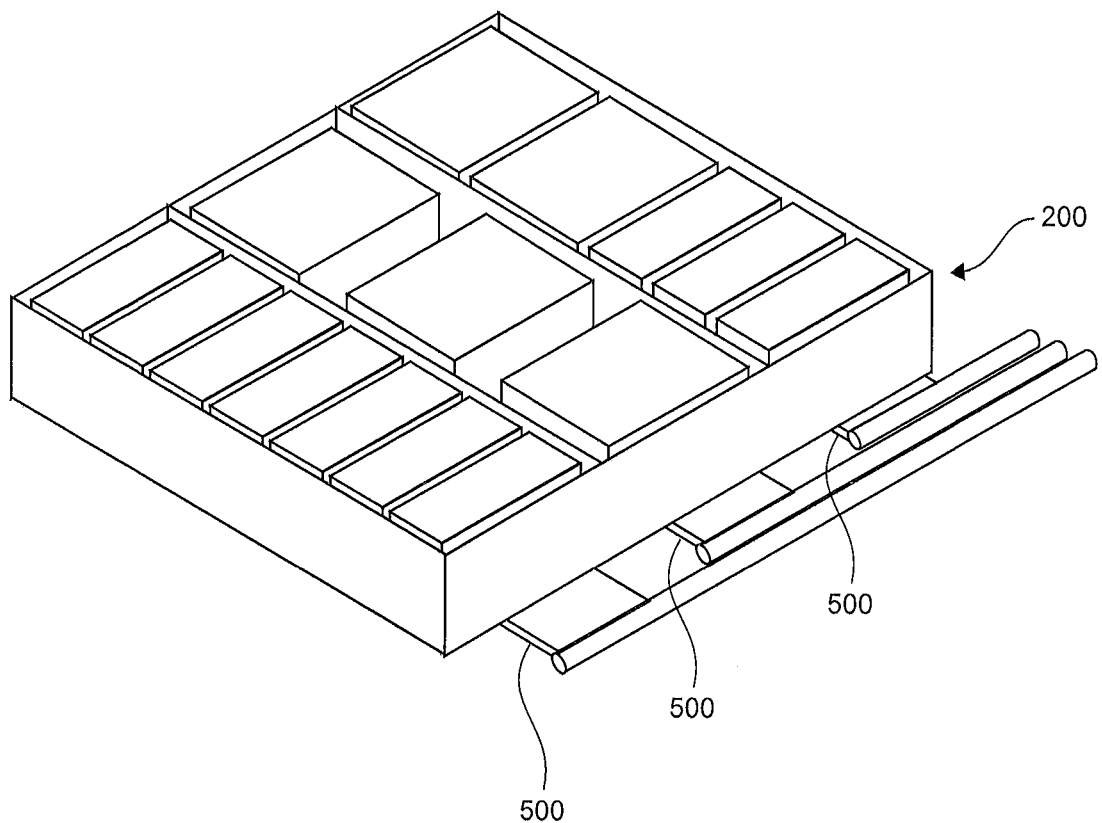
FIG. 5 is a perspective view of another example of a drawer with a number of temperature control elements.

In some embodiments, each drawer 200 may be provided with more than one temperature control element 500. For example, as shown in FIG. 5, a drawer 200 that has three compartments may be provided with three temperature control elements 500, each covering the footprint of a single compartment. In other embodiments, each temperature control element 500 may be arranged to cover the footprint of one or more compartments of the drawer 200 or the footprint of a portion of one or more compartments.

As described above and as shown in FIG. 4, the temperature control element 500 may be a heat exchanger connected to a fluid flow loop 800. In embodiments where the drawer 200 is provided with more than one temperature control element 500 and where each temperature control element 500 is a heat exchanger, each temperature control element 500 may be connected to an individual fluid flow loop 800 such as that shown in FIG. 4. Alternatively, the temperature control elements 500 may be connected in series to form a single fluid flow loop. It will be appreciated that the temperature control elements 500 may be connected in any other suitable manner. For example, in embodiments of the data storage system 2 having more than one drawer 200, a temperature control element 500 of one of the drawers 200 may be connected in series with a temperature control element 500 of another drawer 200.

Figure 1B:
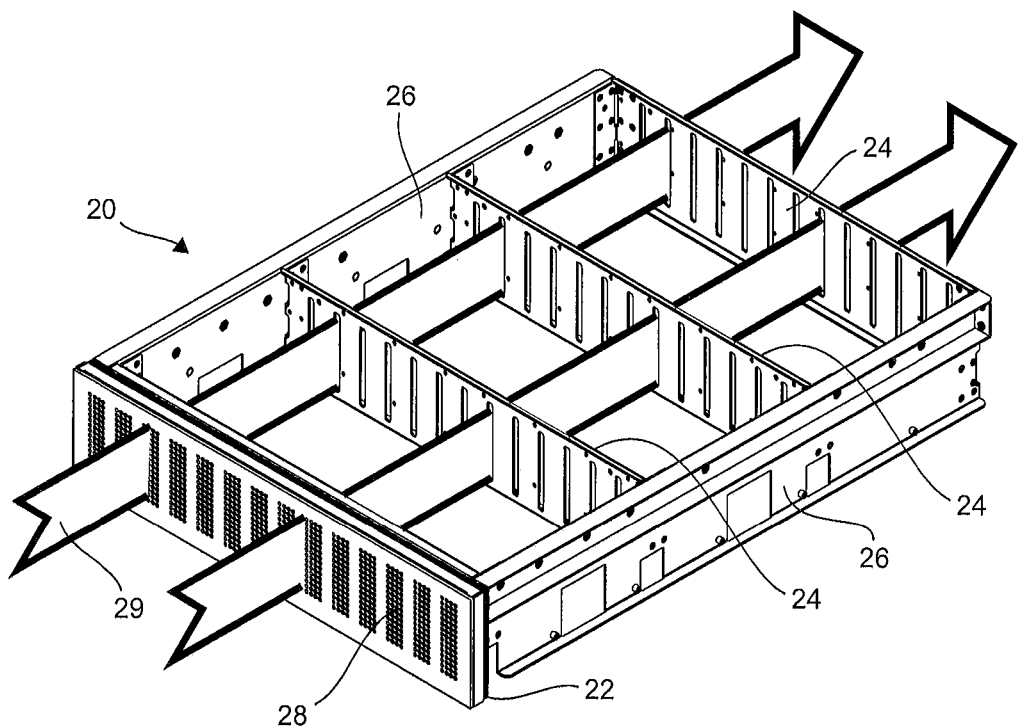
FIG. 1B is a perspective view of an example of a drawer of a data storage system.
Figure 6:
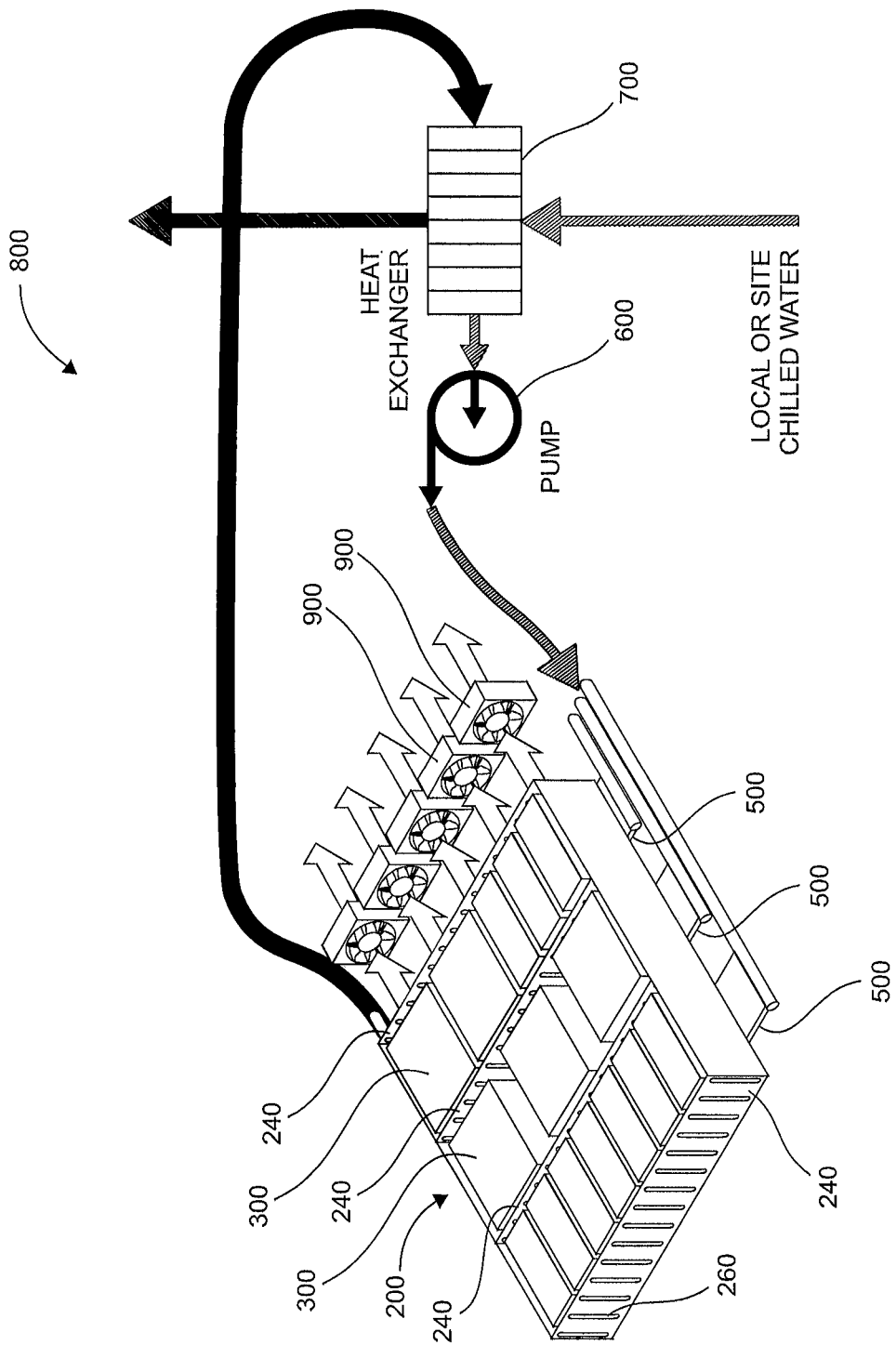
FIG. 6 is a schematic illustration of another example of a drawer with a number of horizontal airflow generating means and a number of temperature control elements connected to a fluid flow loop.

Referring back to FIGS. 3A and 3B, a number of apertures 260 are provided on each cross member 240 of the drawer 200. This arrangement allows air to flow horizontally through the drawer 200 along its primary plane in a manner similar to that shown in FIG. 1A. In some embodiments of the data storage system 2, means for generating a horizontal airflow may be provided within the rack enclosure 100 to provide air cooling for the electronic devices 300 within the drawers 200. FIG. 6 shows an example of these embodiments. In these embodiments, the electronic devices 300 are arranged so that air is able to pass through the drawer 200 horizontally with respect to the rack enclosure 100. In FIG. 6, a populated drawer 200 having a plurality of apertures 260 on each cross member 240, a number of temperature control elements 500 thermally connected to the electronic devices 300 within the drawer 200, a fluid flow loop 800 having a pump 600 and a heat exchanger 700 connected to one of the temperature control elements 500, and a number of horizontal airflow generators 900 are shown in isolation. The horizontal airflow generators 900 may be one or more fans or any other suitable devices capable of generating an airflow. In these embodiments, the air cooling provided by the horizontal airflow generated by the horizontal airflow generators 900 supplements the conductive cooling provided by the temperature control elements 500.

In addition, or as an alternative, to the horizontal airflow generators 900, vertical airflow generators may be provided within the rack enclosure 100 for embodiments where temperature control element 500 of drawer 200 includes one or more apertures or for embodiments where the drawer 200 include more than one temperature control elements 500. In these embodiments, the electronic devices 300 are arranged so that air is able to pass vertically through the drawer 200 with respect to the rack enclosure 100. Similar to the horizontal airflow generators 900 described above, the vertical airflow generators may be one or more fans or any other suitable devices capable of generating an airflow. The vertical airflow generators may be provided near the top of the rack enclosure 100. Alternatively, or additionally, the vertical airflow generators may be provided near the bottom of the rack enclosure 100. The vertical airflow generators are arranged and configured to generate an airflow that travels generally from the bottom of the rack enclosure 100 towards the top. The open top/bottom of the "ladder type" structure of the drawer 200, together with the apertures of the temperature control element 500 and/or the gaps between the temperature control elements 500, allow the airflow generated by the vertical airflow generator to pass through the drawer 200 to cool the electronic devices 300 within the drawer 200.

As discussed above, for each electronic device 300 received within the drawer 200, one or more thermal communication pathways may be established to facilitate heat transfer between the electronic devices 300 and the temperature control elements 500. In general, a thermal contact is positioned between, and thermally connecting, the electronic device 300 and the temperature control element 500. The thermal connections between the electronic device 300 and the thermal contact and between the thermal contact and the temperature control element 500 provide the thermal communication pathway to allow the heat generated by the electronic device 300 during its operation to transfer to the temperature control element 500 by thermal conduction.

Figure 7:
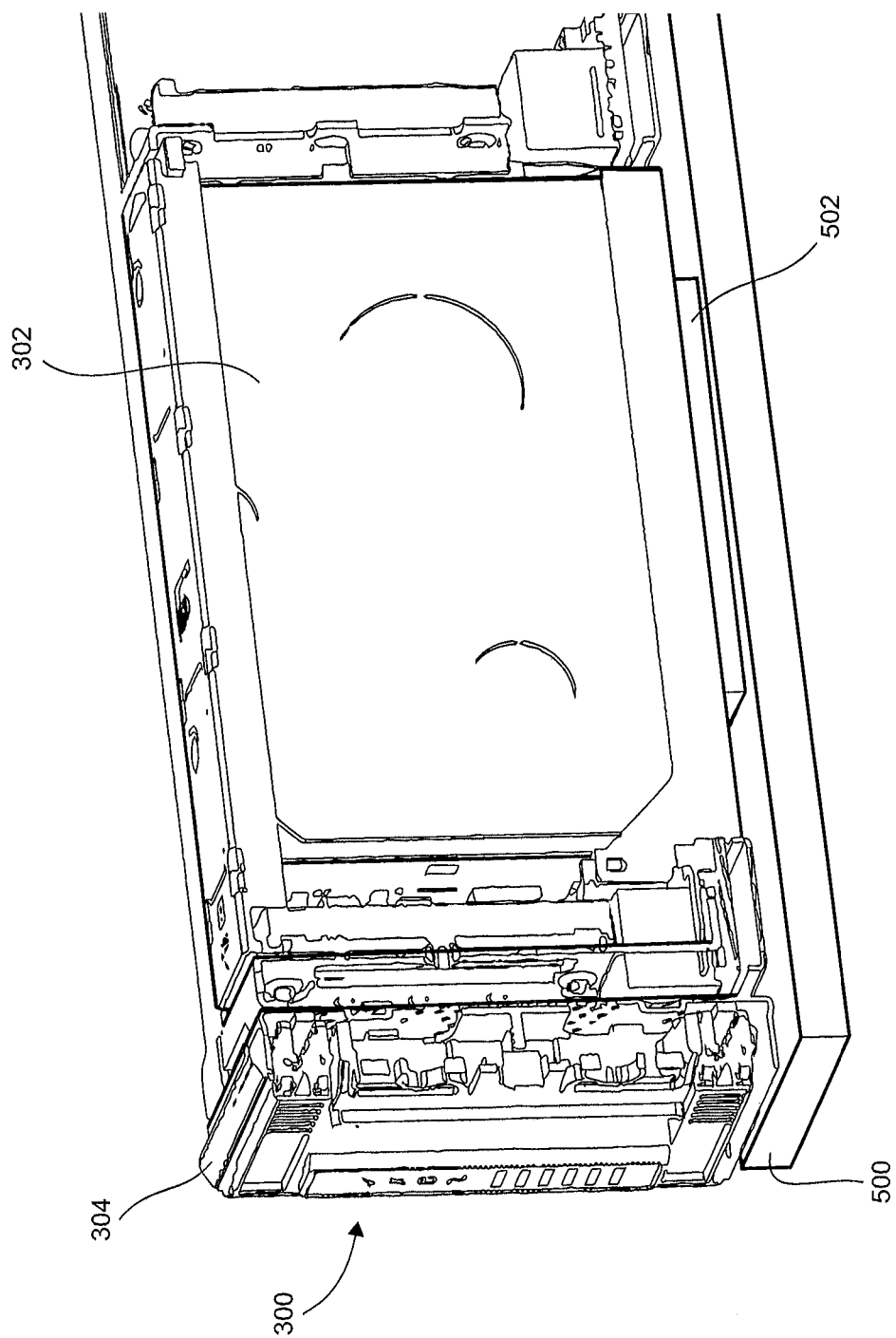
FIG. 7 is a perspective view of an example of a carrier housing a data storage medium and in thermal communication with a temperature control element via a thermal contact.

FIG. 7 shows an example of a thermal communication pathway between a data storage medium 302 and a temperature control element 500. In FIG. 7, a portion of a temperature control element 500 of the embodiments discussed above and an electronic device 300 comprising a data storage medium 302 housed in a carrier 304 are shown in isolation together with a thermal contact 502 for transferring heat from the data storage medium 302 to the temperature control element 500. Thermal contact 502 is preferably formed from a thermally conductive material such as, but not limited to, thermal grease, silicone grease, metal wire wool, and soft polymer. Another example of a material suitable for forming the thermal contact 502 from is carbon nanotube filaments. These can be used to create a brush like structure, which is conformant to the surfaces in contact with it and has a high thermal conductivity. Other examples of materials suitable for forming the thermal contact 502 from are aluminium and elastomer "gap pads" filled with metal particles. In general, the carrier 304 is preferably formed from a thermally conductive material and is able to conduct the heat generated by the data storage medium 302 to the thermal contact 502, which in turn conducts the heat to the temperature control element 500. In the embodiments where the temperature control element 500 is a heat exchanger such as in the examples described above and shown in FIG. 4, the heat generated by the data storage medium 302 is further transferred to the heat exchange fluid within the temperature control element 500. The pump 600 then circulates the heat exchange fluid to the heat exchanger 700 for cooling before continuing to circulate around the fluid low loop 800.

Figure 8:
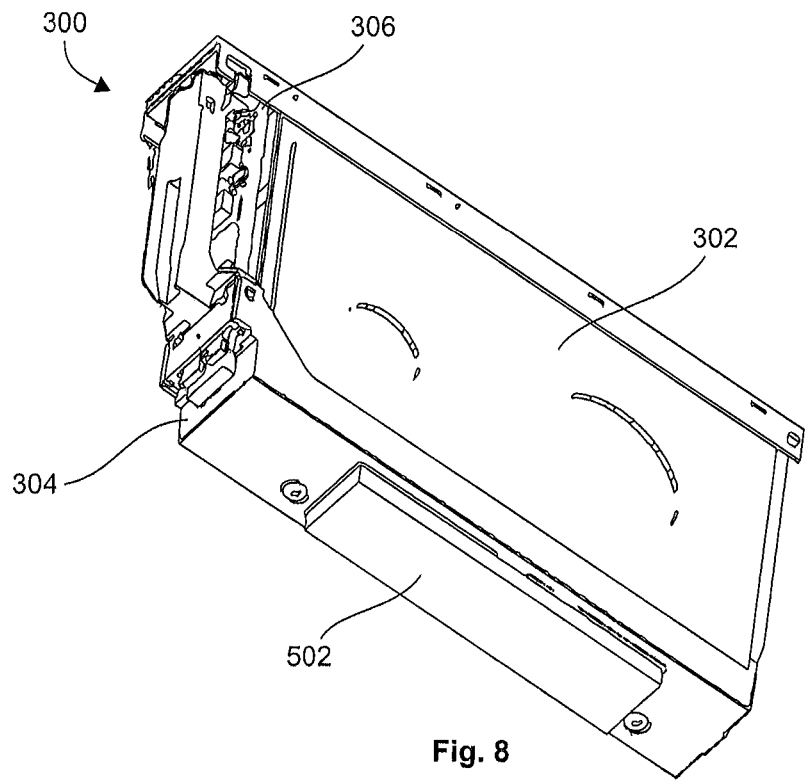
FIG. 8 is a perspective view of a carrier housing a data storage medium and in thermal communication with a thermal contact.

FIG. 8 shows in more detail the arrangement of the thermal contact 502 and the carrier 304. As shown in FIG. 8, the data storage medium 302 is housed within the carrier 304, which may optionally include electronic circuitry 306 as described above. The thermal contact 502 is provided on the side of the carrier 304 and preferably covers a broad area to maximize heat transfer. When received in the drawer 200, the carrier 304 is oriented such that the side of the carrier 304 on which the thermal contact 502 is provided is positioned towards the bottom of the drawer 200 to enable contact with the temperature control element 500.

Figure 9:
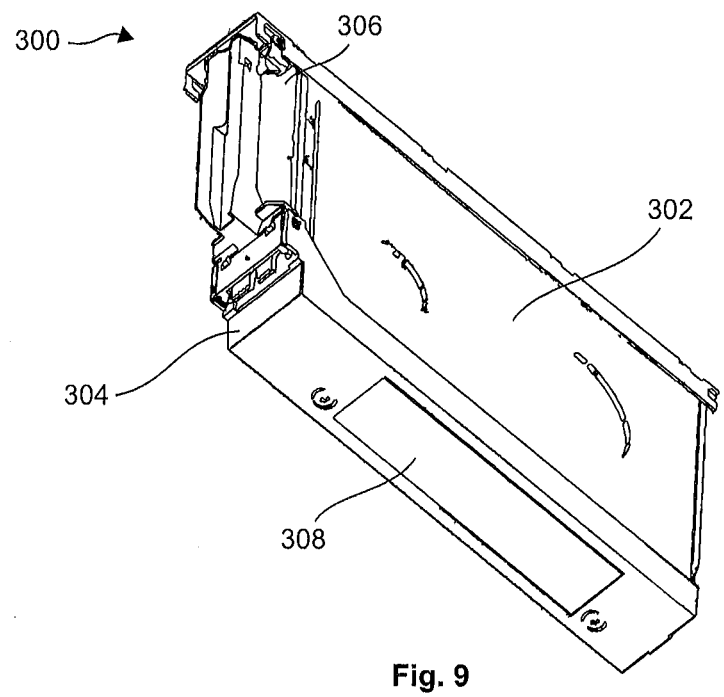
FIG. 9 is a perspective view of another example of a carrier housing a data storage medium.

FIG. 9 shows an arrangement of the carrier 304 according to an alternative embodiment to that of FIG. 8. In this alternative embodiment, at the position where thermal contact 502 is provided in the example of FIG. 8, an opening 308 is provided on the side of the carrier 304 to allow access to the data storage medium 302 housed therein. The opening 308 allows the thermal contact 502 to extend through and be in direct contact with the data storage medium 302 so as to enable direct thermal communication between the data storage medium 302 and the temperature control element 500.

When in operation, the drawer type data storage system of the above described embodiments enables electronic devices that are loaded into the drawers of the data storage system to be cooled by temperature control elements. Additional cooling can optionally be provided by horizontal and/or vertical airflow. The above described embodiments thus provide improved flexibility for cooling electronic devices, data storage media such as disk drives in particular, in a data storage system.

Embodiments of the present invention have been described with particular reference to the examples illustrated. However, it will be appreciated that variations and modifications may be made to the examples described within the scope of the appending claims.

The invention claimed is:
1. A data storage system, comprising:
an enclosure;
one or more drawer structures slideable into and out from the enclosure, at least one of the drawer structures having therein one or more electronic devices including at least one data storage medium housed in a carrier comprising a thermally conductive material, the carrier including an opening therethrough to the data storage medium;
one or more temperature control elements positioned adjacent to and extending under and slideable into and out from the enclosure with the at least one drawer structure, the one or more temperature control elements arranged to thermally communicate with at least one of the electronic devices; and one or more thermal contacts in physical contact with at least one of the temperature control elements and with at least one of the electronic devices.

2. A data storage system as claimed in claim 1, wherein at least one of the thermal contacts is formed from a thermally conducting material comprising at least one of the following: thermal grease, silicone grease, metal wire wool, soft polymer, aluminium, carbon nanotube, and elastomer.

3. A data storage system as claimed in claim 1, wherein the at least one drawer structure comprises one or more cross members having at least one aperture and is configured to receive the one or more electronic devices arranged so as to enable air to pass horizontally.

4. A data storage system as claimed in claim 1, wherein the at least one drawer structure comprises one or both of an open top and an open bottom, wherein the one or more electronic devices are arranged so as to enable air to pass vertically through the drawer structure.

5. A data storage system as claimed in claim 1, wherein at least one of the temperature control elements includes one or more apertures.

6. A data storage system as claimed in claim 1, wherein at least one of the drawer structures is arranged to be in thermal communication with at least one of the temperature control elements.

7. A data storage system as claimed in claim 4, wherein the at least one drawer structure comprises both the open top and the open bottom.

8. A data storage system as claimed in claim 1, wherein the one or more electronic devices are hot pluggable in the at least one of the drawer structures.

9. A data storage system, comprising:
an enclosure;
a drawer structure slideable into and out from the enclosure, the drawer structure having at least one compartment defined by two side members, two cross members, and having a top side and a bottom side, the compartment configured to receive one or more electronic devices that are operably connected when the drawer structure is slid out from the enclosure;
a temperature control element adjacent to the bottom side, external to the drawer structure, extending from and between one or both of the two cross members and the two side members and in thermal communication with at least one of the electronic devices, the temperature control element slideable into and out from the enclosure with the drawer structure and including a fluid inlet, a fluid outlet, and a fluid flow path from the inlet to the outlet; and
a heat exchange fluid in the fluid flow path.

10. A data storage system as claimed in claim 9, further comprising a thermally conductive contact positioned between and in contact with each of the drawer structure and the temperature control element.

11. A data storage system as claimed in claim 9, wherein the heat exchange fluid is water.

12. A data storage system as claimed in claim 9, wherein the temperature control element extends from and between the two cross members and from and between the two side members.

13. A data storage system as claimed in claim 9, the cross members having at least one aperture.

14. A data storage system as claimed in claim 9, wherein the one or more electronic devices includes at least one data storage medium housed in a carrier comprising a thermally conductive material.

15. A data storage system as claimed in claim 9, further comprising a thermal contact arranged to provide a thermal communication pathway between the temperature control element and at least one of the electronic devices;
wherein the one or more electronic devices include at least one data storage device; and
wherein the carrier includes an opening so as to enable the thermal communication pathway to extend therethrough to the date storage medium.

16. A data storage system as claimed in claim 15, wherein the thermal contact is formed from a thermally conductive material comprising at least one of the following: thermal grease, silicone grease, metal wire wool, soft polymer, aluminium, carbon nanotube, and elastomer.

17. A data storage system as claimed in claim 15, wherein the drawer structure comprises an open bottom.

18. A data storage system as claimed in claim 17, wherein the drawer structure further comprises an open top and is configured to receive the one or more electronic devices arranged so as to enable air to pass vertically.

19. A data storage system as claimed in claim 9, wherein the temperature control element includes one or more apertures therethrough.

20. A data storage system, comprising:
an enclosure;
a plurality of drawer structures slideable into and out from the enclosure, each drawer structure having two side members and at least two cross members, the two side members and two cross members defining a compartment having an open top; and
a plurality of thermally conductive temperature control elements, each drawer structure having a temperature control element adjacent to the bottom side of the drawer structure, external to the drawer structure, slideable into and out from the enclosure with the drawer structure, and in thermal communication with the compartment.

* * * * *